(12) United States Patent
Sheng et al.

(10) Patent No.: US 11,094,647 B2
(45) Date of Patent: Aug. 17, 2021

(54) METHODS AND APPARATUS TO ELIMINATE WAFER BOW FOR CVD AND PATTERNING HVM SYSTEMS

(71) Applicant: Applied Materials, Inc., Santa Clara, CA (US)

(72) Inventors: Shuran Sheng, Saratoga, CA (US); Lin Zhang, San Jose, CA (US); Joseph C. Werner, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/533,145

(22) Filed: Aug. 6, 2019

(65) Prior Publication Data
US 2020/0098702 A1    Mar. 26, 2020

Related U.S. Application Data

(60) Provisional application No. 62/736,219, filed on Sep. 25, 2018.

(51) Int. Cl.
| | |
|---|---|
| *H01L 21/02* | (2006.01) |
| *H01L 23/00* | (2006.01) |
| *H01L 27/11582* | (2017.01) |
| *C23C 16/50* | (2006.01) |
| *C23C 16/26* | (2006.01) |
| *C23C 14/10* | (2006.01) |
| *C23C 14/06* | (2006.01) |
| *C23C 16/40* | (2006.01) |

(Continued)

(52) U.S. Cl.
CPC ........ *H01L 23/562* (2013.01); *C23C 14/0605* (2013.01); *C23C 14/0652* (2013.01); *C23C 14/10* (2013.01); *C23C 14/35* (2013.01); *C23C 16/26* (2013.01); *C23C 16/345* (2013.01); *C23C 16/402* (2013.01); *C23C 16/50* (2013.01); *H01L 21/0217* (2013.01); *H01L 21/02115* (2013.01); *H01L 21/02164* (2013.01); *H01L 27/11582* (2013.01)

(58) Field of Classification Search
None
See application file for complete search history.

(56) References Cited

U.S. PATENT DOCUMENTS

| | | |
|---|---|---|
| 2004/0079289 A1 | 4/2004 | Kellerman et al. |
| 2008/0066684 A1 | 3/2008 | Patalay et al. |
| | (Continued) | |

FOREIGN PATENT DOCUMENTS

KR    10-20080092767 A    10/2008

OTHER PUBLICATIONS

International Search Report and Written Opinion for Application No. PCT/US2019/043040 dated Nov. 25, 2019.

*Primary Examiner* — Asok K Sarkar
(74) *Attorney, Agent, or Firm* — Patterson + Sheridan LLP

(57) ABSTRACT

A method and apparatus for forming a backside coating on a substrate to counteract stresses from a previously deposited film is disclosed. In one embodiment, a method for flattening a bowed substrate includes providing a substrate having a film stack formed on a first major surface thereof, wherein the substrate comprises a bowed orientation, and forming a coating a second major surface of the substrate, wherein the coating is configured to counter stresses produced by the film stack and flattens the substrate from the bowed orientation.

20 Claims, 8 Drawing Sheets

(51) Int. Cl.
    *C23C 16/34*     (2006.01)
    *C23C 14/35*     (2006.01)

(56) References Cited

U.S. PATENT DOCUMENTS

| | | |
|---|---|---|
| 2015/0340225 A1 | 11/2015 | Kim et al. |
| 2018/0082960 A1 | 3/2018 | Bellotti et al. |
| 2019/0062918 A1* | 2/2019 | Shaikh .................... C23C 16/52 |
| 2020/0058486 A1* | 2/2020 | Dai ..................... G03F 7/70783 |

* cited by examiner

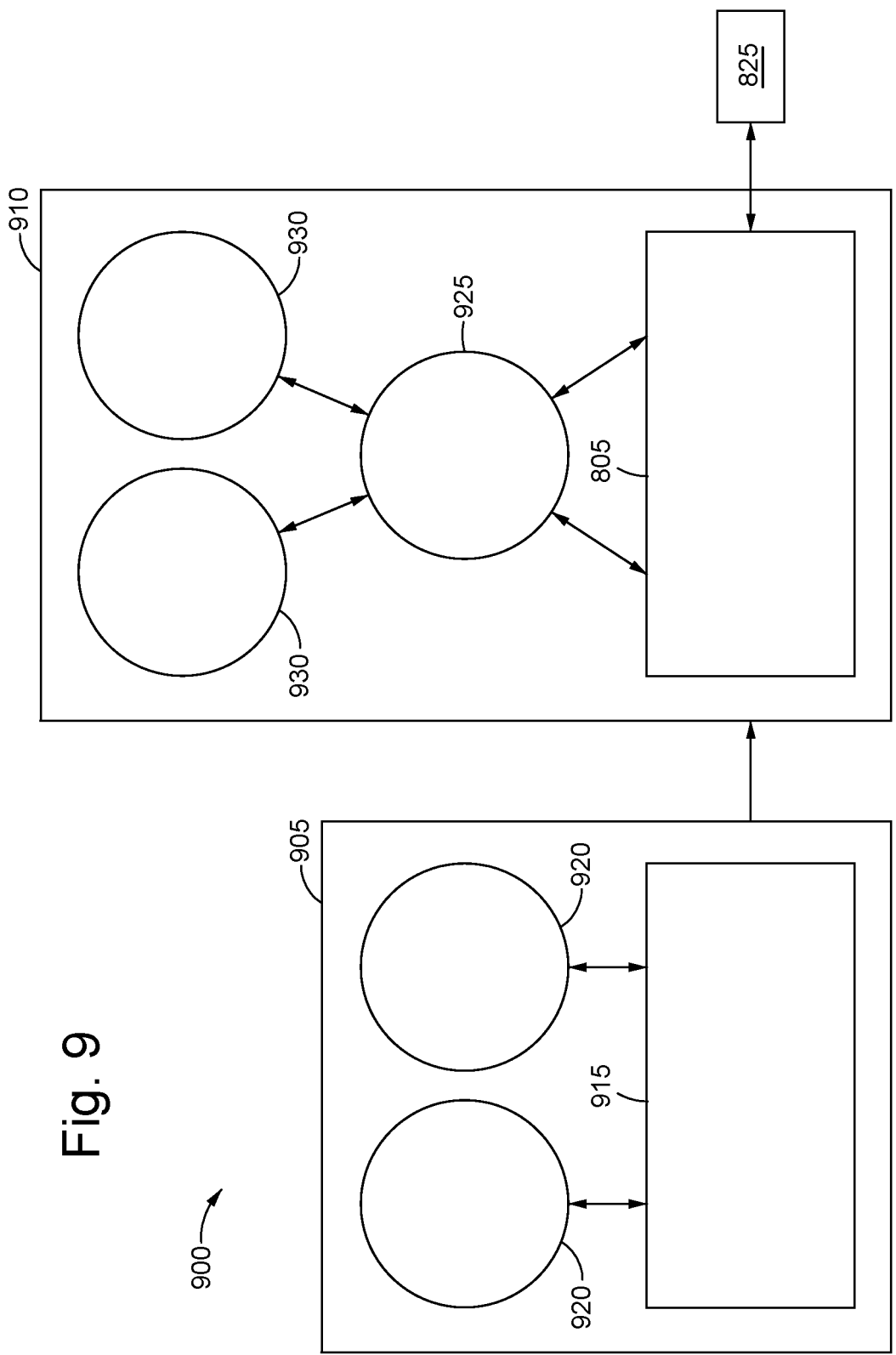

METHODS AND APPARATUS TO ELIMINATE WAFER BOW FOR CVD AND PATTERNING HVM SYSTEMS

CROSS-REFERENCE TO RELATED APPLICATION

This application claims benefit of United States Provisional Patent Application No. 62/736,219, filed Sep. 25, 2018, which is incorporated by reference herein.

BACKGROUND

Field

Methods and apparatus for semiconductor device processing are disclosed herein. More specifically, embodiments disclosed herein relate to methods and apparatus for elimination of substrate bow or warpage in deposition and patterning high volume manufacturing (HVM) systems.

Description of the Related Art

Three dimensional (3D) memory devices, such as 3D NAND, 3D MRAM, etc., have been developed in a variety of configurations that include vertical channel structures. In vertical channel structures, memory cells including charge storage structures are disposed at interface regions between horizontal planes of conductive strips arranged as word lines, and vertical active strips including channels for the memory cells.

The 3D NAND memory product roadmap is believed to scale up rapidly from the current BiCS3 64 layer to a BiCS4 96 layer, a BiCS5 128 layer, and even more layer stacking BiCS6, and beyond (256 layer to 512 layer), memory products. Such increased density introduces manufacturing process challenges such as bow or warpage of the underlying substrate.

Bow or warpage of the substrate creates challenges in handling of the substrate as well as depositing subsequent layers and/or depositing or patterning hardmask films. Excessive substrate bow may also lead to arcing which may damage process kits, lead to poor process uniformity due to uncontrolled parasitic local discharges, variations in the gaps or spacing above or below the substrate, and/or substrate temperature variations.

What is needed is a method and apparatus to minimize or control substrate bow or warpage.

SUMMARY

The present disclosure generally provides a method and apparatus to minimize or control substrate bow or warpage in high density memory device fabrication.

In one embodiment, a method for flattening a bowed substrate includes providing a substrate having a film stack formed on a first major surface thereof, wherein the substrate comprises a bowed orientation and forming a coating a second major surface of the substrate, wherein the coating is configured to counter stresses produced by the film stack and flattens the substrate from the bowed orientation.

In another embodiment, a method for flattening a bowed substrate includes providing a substrate having a film stack formed on a first major surface thereof into a backside coating chamber, wherein the substrate comprises a bowed orientation, and forming a coating a second major surface of the substrate, wherein the coating is configured to counter stresses produced by the film stack and flattens the substrate from the bowed orientation.

In another embodiment, a backside coating chamber is provided that includes a stage configured to receive a substrate in a face down orientation, the substrate having a film stack formed on a first major surface thereof, a holder coupled to the stage for holding the substrate by an edge thereof, and a coating apparatus for depositing a backside coating onto a second major surface thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 9 is a schematic diagram of one embodiment of a fabrication system for fabricating memory devices.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally provides a method and apparatus to minimize or control substrate bow or warpage in high density memory device fabrication. The method includes receiving an incoming substrate having a memory film stack formed on a first major surface thereof. The memory film stack includes relatively thick stacks of films, such as multiple oxynitride films, silicon dioxide, silicon nitride and/or polysilicon films. The memory film stack formed on the first major surface of the substrate induces stresses within the substrate that causes the substrate to bow or warp. The bow or warpage creates numerous issues for subsequent processes. The method includes depositing a backside coating onto a second major surface of the substrate. The backside coating includes one or more blanket layers, graded layers, profiled coatings and/or a pattern of one or more films. The backside coating is configured to relieve or counter the stress in the substrate caused by the memory film stack formed on the first major surface of the substrate.

The apparatus includes a backside processing chamber capable of deposition of the backside coating on the second major surface of the substrate or etching the deposited backside coating off the second major surface. The backside processing chamber eliminates the need to flip the substrate which minimizes substrate handling tools as well as damage to the memory film stack formed on the first major surface of the substrate.

Figure 1:
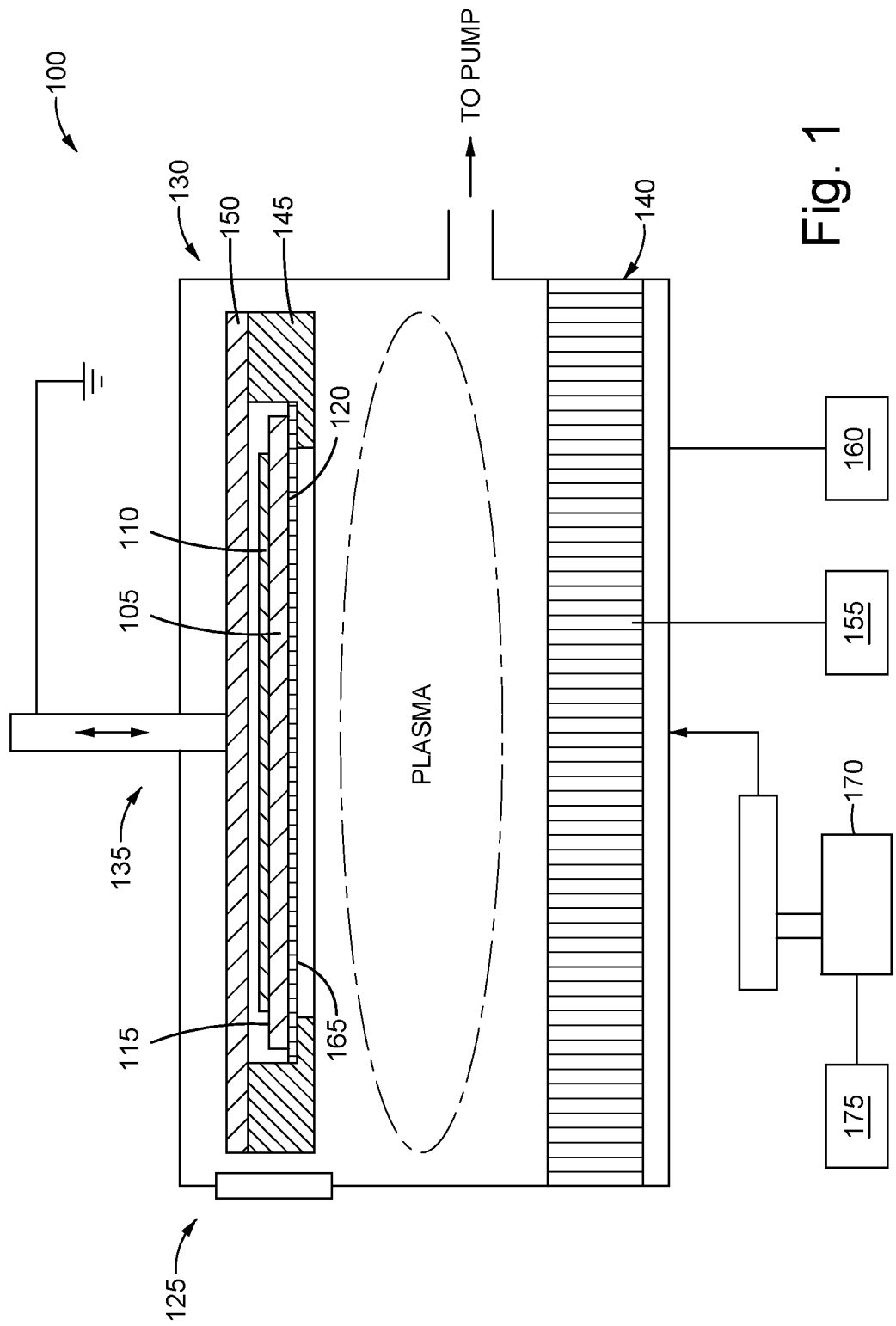
FIG. 1 is a schematic sectional view of one embodiment of a backside processing chamber as disclosed herein.

FIG. 1 is a schematic sectional view of one embodiment of a backside processing chamber 100. The backside processing chamber 100 according to this embodiment is a plasma enhanced chemical vapor deposition chamber. In some embodiments, the backside processing chamber 100 shown in FIG. 1 is also capable of an etch process using plasma. In other embodiments, the backside processing chamber 100 is either capable of deposition or etching such that separate chambers are necessary for each process.

The backside processing chamber 100 is configured to receive a substrate 105 with a memory film stack 110 formed on a first major surface (first side) 115 and deposit a backside coating (described below) onto a second major surface (second side) 120 that is opposite to the first major surface 115. While the substrate 105 is shown as flat, the substrate 105 would be bowed before treatment in the backside processing chamber 100 due to stresses formed in the substrate by the memory film stack 110. The backside coating is applied using a deposition apparatus performing a coating process on the second major surface 120 to counteract the stresses in the substrate 105 formed by application of the memory film stack 110 on the first major surface 115.

The substrate 105 is transferred into the backside processing chamber 100 via a transfer port 125 and to a stage 130. The stage 130 is adapted to receive and hold the substrate 105 in a face down orientation (i.e., with the first major surface 115 facing upward and the second major surface 120 facing downward). The stage 130 is coupled to a stem 135 that is movable in at least a vertical (up and down) direction to change a spacing between a perforated faceplate 140. The stage 130 includes a holder 145 that suspends the substrate 105 from an edge thereof. The stage 130 includes a heater 150 to control the temperature of the substrate 105.

The backside processing chamber 100 is configured to deposit films onto the second major surface 120 and/or etch films previously formed on the second major surface 120. The backside processing chamber 100 is coupled to a power source 155 for forming a plasma in the chamber. The power source 155 is configured to form a plasma by applying a radio frequency power, a very high frequency (RF) power in a capacitively coupled plasma application. an inductively coupled power (ICP) application, a microwave power application, a reactive ion etching (RIE) power application, or an electron cyclotron resonance (ECR) power application. The backside processing chamber 100 is also coupled to a gas source 160.

In a deposition process, the gas source 160 includes precursor gases for forming dielectric films, semiconductive films, or metal films using the plasma as the backside coating. In the deposition process, a mask 165 may optionally be utilized to form a specific pattern of films on the second major surface 120 of the substrate 105. In an etch process, the gas source 160 includes various gases utilized to form the plasma for removing dielectric films, semiconductive films, or metal films previously formed on the second major surface 120 of the substrate 105.

The backside processing chamber 100 is also coupled to a remote plasma chamber 170. The remote plasma chamber 170 is coupled to a cleaning gas source 175. Cleaning gases from the cleaning gas source 175 are provided to the remote plasma chamber 170 where the cleaning gases are energized and provided to the backside processing chamber 100 as a plasma that is utilized to clean interior components of the backside processing chamber 100.

Figure 2:
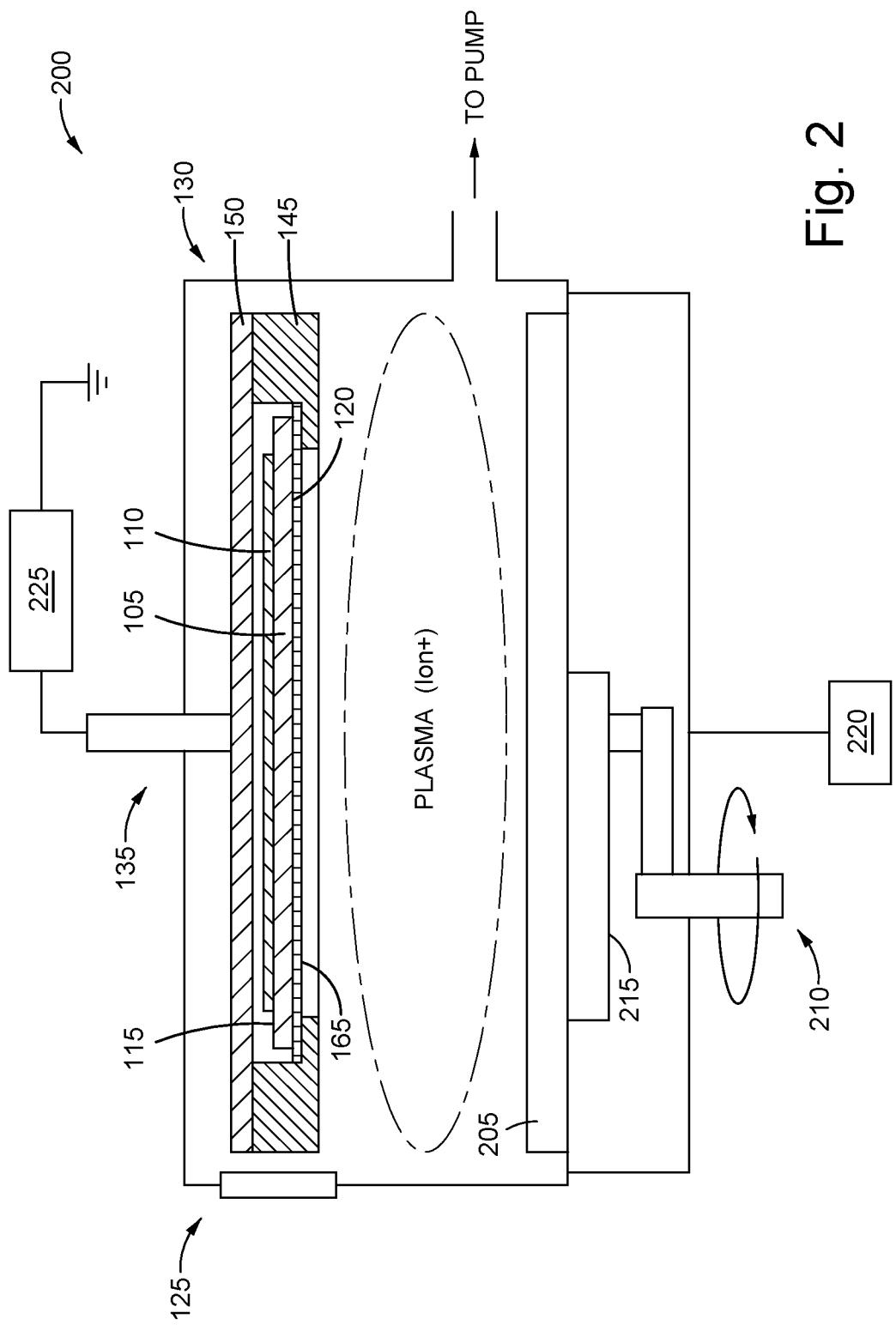
FIG. 2 is a schematic sectional view of another embodiment of a backside processing chamber as disclosed herein.

FIG. 2 is a schematic sectional view of another embodiment of a backside processing chamber 200. The backside processing chamber 200 according to this embodiment is a physical vapor deposition (PVD) chamber. Common reference numerals utilized in the backside processing chamber 100 of FIG. 1 indicate the same components in FIG. 2 and will not be explained in detail, for brevity.

The backside processing chamber 200 is configured to receive the substrate 105 with the memory film stack 110 formed on the first major surface (first side) 115 and deposit a backside coating (described below) onto the second major surface (second side) 120 that is opposite to the first major surface 115. While the substrate 105 is shown as flat, the substrate 105 would be bowed before treatment in the backside processing chamber 200 due to stresses formed in the substrate 105 by the memory film stack 110. The backside coating is applied using a deposition process to counteract the stresses in the substrate 105 formed by application of the memory film stack 110.

In this embodiment, the backside processing chamber 200 utilizes a target 205 and a magnetron 210 comprising a magnet 215 to deposit dielectric films, semiconductive films, or metal films on the second major surface 120 of the substrate 105 as the backside coating. The magnetron 210 is coupled to a power source 220 which may be radio frequency power and/or direct current power. The backside processing chamber 200 is coupled to a tuning circuit 225 and/or a bias power source with an RF match. The tuning circuit 225 may be an automatic capacitance tuner (ACT) or an RF match. The bias power source may utilize RF power and/or DC power.

Figure 3:
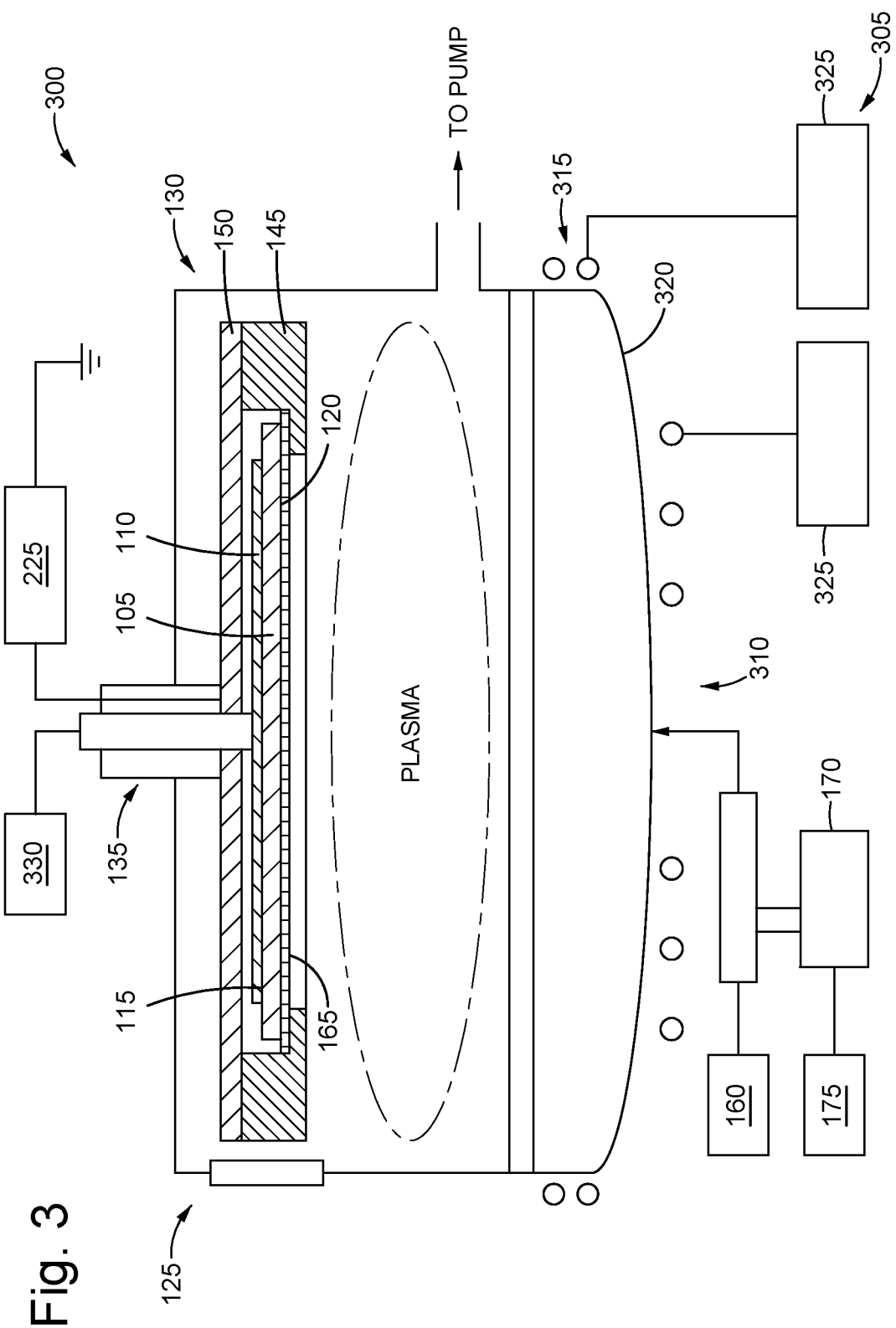
FIG. 3 is a schematic sectional view of another embodiment of a backside processing chamber as disclosed herein.

FIG. 3 is a schematic sectional view of another embodiment of a backside processing chamber 300. The backside processing chamber 300 according to this embodiment is an inductively coupled plasma (ICP) deposition chamber. Common reference numerals utilized in the backside processing chamber 100 of FIG. 1 indicate the same components in FIG. 3 and will not be explained in detail, for brevity.

The backside processing chamber 300 is configured to receive the substrate 105 with the memory film stack 110 formed on the first major surface (first side) 115 and deposit a backside coating (described below) onto the second major surface (second side) 120 that is opposite to the first major surface 115. While the substrate 105 is shown as flat, the substrate 105 would be bowed before treatment in the backside processing chamber 300 due to stresses formed in the substrate 105 by the memory film stack 110. The backside coating is applied using a deposition process to counteract the stresses in the substrate 105 formed by application of the memory film stack 110.

In this embodiment, the backside processing chamber 300 utilizes a inductive coil system 305 to deposit dielectric films, semiconductive films, or metal films on the second major surface 120 of the substrate 105 as the backside coating. The inductive coil system 305 includes one or more bottom coils 310 and one or more side coils 315 disposed adjacent to a dielectric dome 320. One or more power sources 325 are coupled to the bottom coils 310 and/or the side coils 315. The one or more power sources 325 may be a RF power source. The backside processing chamber 300 is coupled to a front side gas source 330, which supplies a gas to the first major surface 115 during deposition. The front side gas source 330 may be helium. The backside processing chamber 300 is also coupled to the gas source 160. The gas source 160 includes precursor gases for forming dielectric films, semiconductive films, or metal films using the plasma as the backside coating.

Figure 4A:
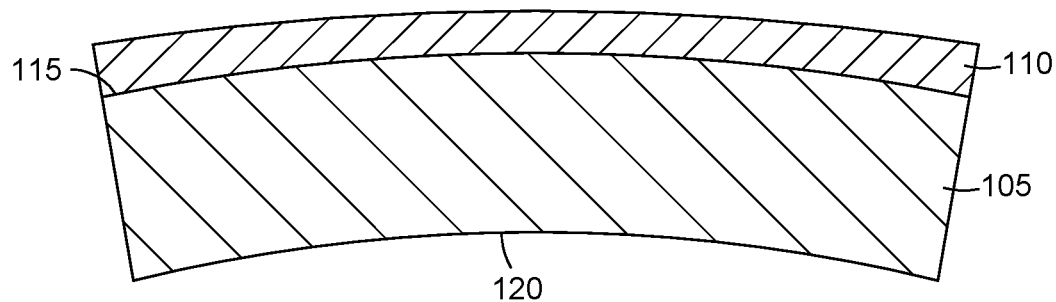
FIGS. 4A and 4B are schematic side views of substrates that are bowed by a film stack deposited onto a first major surface thereof.
Figure 4B:
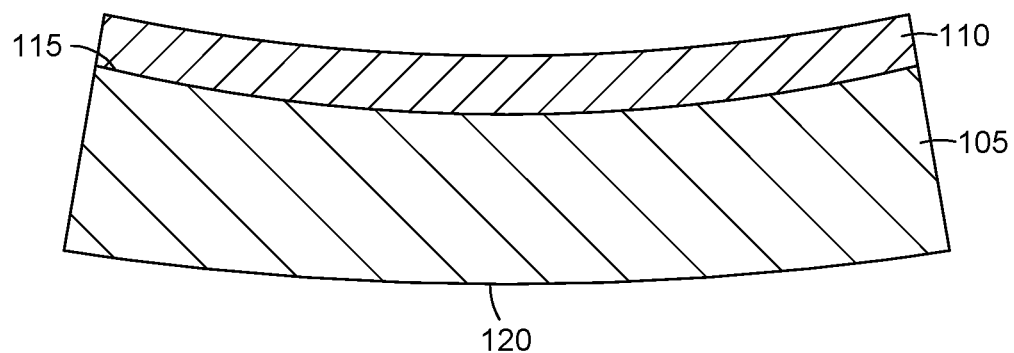

FIGS. 4A and 4B are schematic side views of substrates 105 that are bowed by the memory film stack 110 deposited onto the first major surface 115 thereof. The substrate 105 shown in FIG. 4A is undergoing compressive stress which bows the substrate 105 in a convex shape while the substrate 105 shown in FIG. 4B is undergoing tensile stress which bows the substrate 105 in a concave shape. The shapes of the substrates 105 shown in FIGS. 4A and 4B are indicative of the state the substrates 105 would be when transferred into the backside processing chambers shown in FIGS. 1-3 for application of a backside coating onto the second major surface 120 of the substrates 105 described in detail below.

Figure 5A:
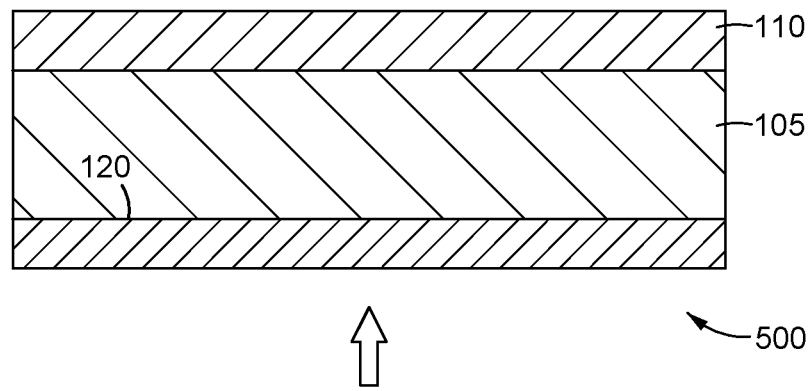
FIG. 5A is a schematic sectional view of either of the substrates shown in FIG. 4A or 4B after a backside coating has been applied to a second major surface thereof.

FIG. 5A is a schematic sectional view of either of the substrates 105 shown in FIG. 4A or 4B after a backside coating 500 has been applied to the second major surface 120 thereof. The backside coating 500 is applied utilizing one of the backside processing chambers shown in FIGS. 1-3.

In this embodiment, the backside coating 500 comprises one or more films of silicon oxide (SiO or $SiO_2$), silicon nitride (SiN), carbon, or a combination thereof. The films utilized may be varied based on factors such as stress, coefficient of thermal expansion (CTE), thickness in order to flatten the substrate 105 as shown in FIG. 5A. The backside coating 500 may be one or a combination of layers. The backside coating 500 may have a maximum thickness of about 100 microns, or less.

Figure 5B:
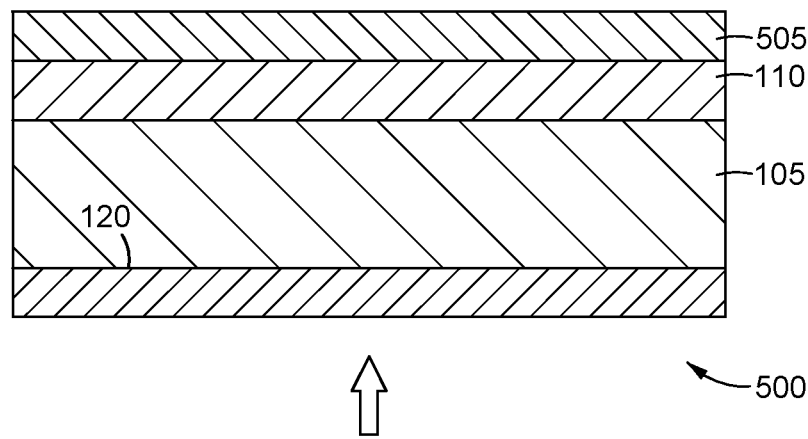
FIG. 5B is a schematic sectional view of a substrate having the backside coating formed thereon.

FIG. 5B is a schematic sectional view of the substrate 105 having the backside coating 500 formed thereon. After the backside coating 500 is applied and the substrate 105 is flattened, the substrate 105 is transferred to a deposition chamber that deposits a hardmask layer 505 on the memory film stack 110. The substrate 105 with the hardmask layer 505 thereon may be transferred to a patterning chamber for further processing with the backside coating 500 thereon.

Figure 5C:
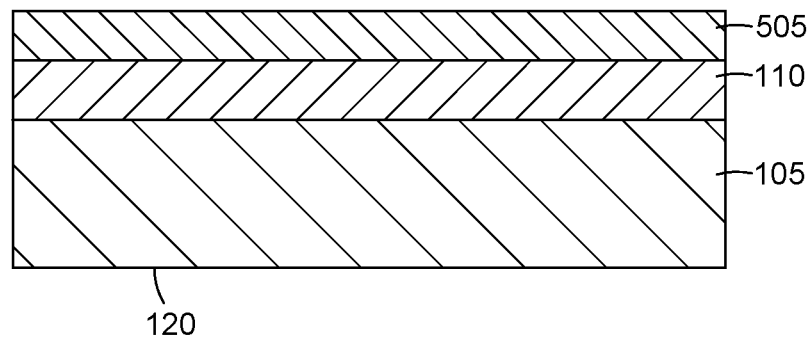
FIG. 5C is a schematic sectional view of a substrate with a hardmask layer disposed on a film stack.

Alternatively, as shown in FIG. 5C, the substrate 105 with the hardmask layer 505 thereon may be transferred to the backside processing chamber 100 shown in FIG. 1 where the backside coating 500 is etched off to expose the second major surface 120. In some embodiments, the backside coating 500 is left on the memory film stack 110 until patterning, lithography and etching of the memory film stack 110 is completed in order to prevent bowing. After all processing, the backside coating 500 may be etched off of the substrate 105 in the backside processing chamber 100 shown in FIG. 1.

Figure 6A:
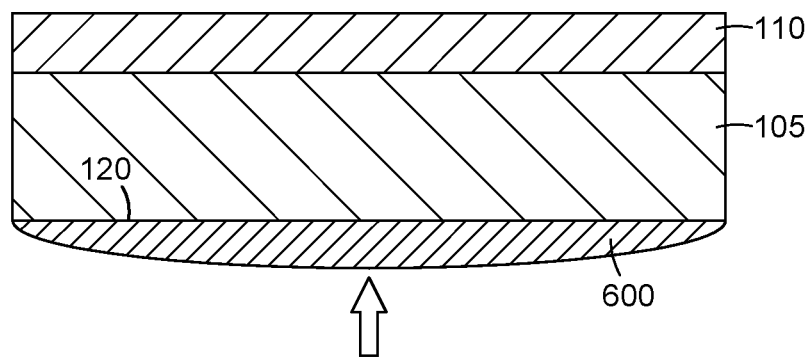
FIG. 6A and FIG. 6B are schematic sectional views of substrates having other embodiments of a backside coating formed thereon.
Figure 6B:
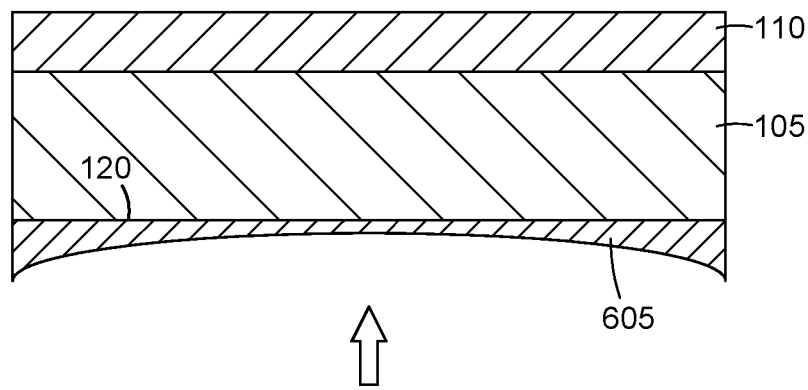

FIG. 6A and FIG. 6B are schematic sectional views of substrates 105 having other embodiments of a backside coating formed thereon. The backside coating is shown as backside coating 600 in FIG. 6A and backside coating 605 in FIG. 6B. The backside coating 600 and the backside coating 605 are profiled coatings in this embodiment, and are formed in one of the backside processing chambers shown in FIGS. 1-3.

The backside coating 600 is concave relative to the second major surface 120 of the substrate 105. The backside coating 605 is convex relative to the substrate 105. The backside coating 600 may be utilized to flatten the substrate 105 shown on FIG. 4A and the backside coating 605 may be utilized to flatten the substrate 105 shown in FIG. 4B.

The backside coating 600 and the backside coating 605 comprise the same films as described for the backside coating 500 of FIG. 5A. The backside coatings 600 and 605 may have a maximum thickness of about 100 microns, or less. The profile may be varied to form the concave profile or convex profile by one or a combination of modulating gas flow by utilizing one or a combination of a blocker plate, a baffle plate and multiple gas feeds. The profile may be varied to form the concave profile or convex profile by varying chamber hardware. Varying chamber hardware includes variations of holes in the faceplate, such as coned gas passages having varied depths across the faceplate and/or variations in choke holes (a portion of each perforation in the faceplate that has a diameter that is less than the remainder of the perforation). Chamber hardware modifications are utilized to provide a gradient for plasma modulation and/or plasma density. In one embodiment, variations of gas passages in the perforated faceplate 140 of FIG. 1 may be provided to form the profiles shown in FIGS. 6A and 6B. Alternatively or additionally, the mask 165 shown in FIGS. 1-3 may be utilized to form the profiles shown in FIGS. 6A and 6B using the backside processing chambers shown in FIGS. 1-3.

After flattening, the substrates 105 may be transferred to a deposition chamber to form the hardmask layer 505 shown in FIG. 5B. The backside coating 600 or the backside coating 605 may be etched after the hardmask layer 505 is formed, or left intact until processing of the substrates 105 is completed, as described above in FIG. 5C.

Figure 7A:
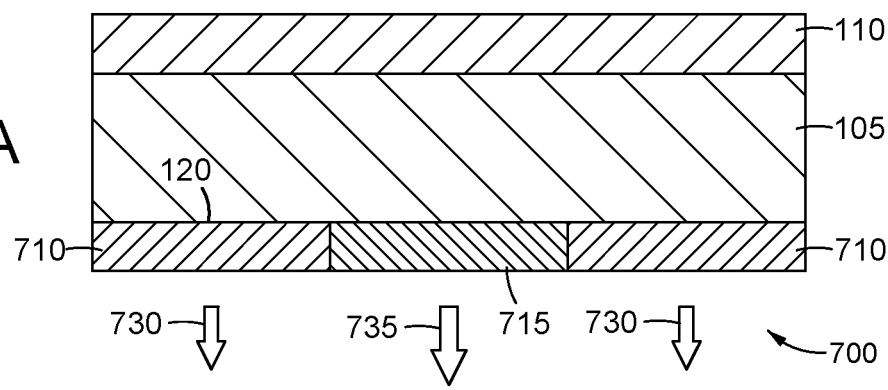
FIG. 7A and FIG. 7B are schematic sectional views of substrates having other embodiments of a backside coating formed thereon.
Figure 7B:
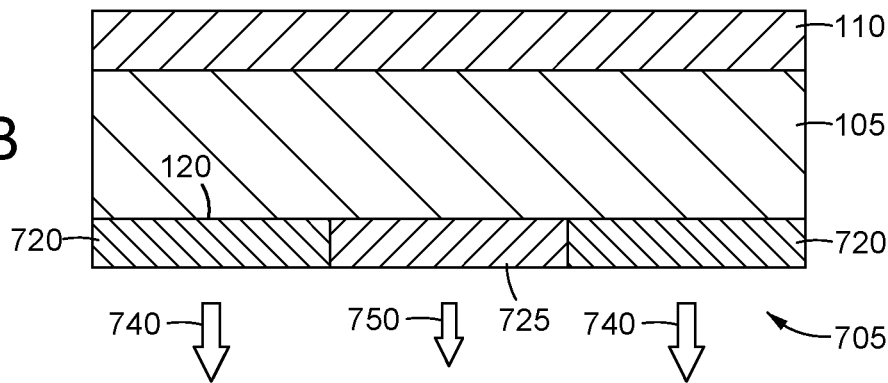

FIG. 7A and FIG. 7B are schematic sectional views of substrates 105 having other embodiments of a backside coating formed thereon. The backside coating is shown as backside coating 700 in FIG. 7A and backside coating 705 in FIG. 7B. The backside coating 700 and the backside coating 705 are patterned coatings in this embodiment, and are formed in one of the backside processing chambers shown in FIGS. 1-3. Alternatively or additionally, the mask 165 shown in FIGS. 1-3 may be utilized to form the patterns shown in FIGS. 7A and 7B using the backside processing chambers shown in FIGS. 1-3.

The backside coating 700 may be utilized to flatten the substrate 105 shown on FIG. 4A and the backside coating 705 may be utilized to flatten the substrate 105 shown in FIG. 4B.

The backside coating 700 and the backside coating 705 comprise the same films as described for the backside coating 500 of FIG. 5A. The backside coatings 700 and 705 may have a maximum thickness of about 100 microns, or less. The backside coating 700 includes a first portion 710 and a second portion 715. The portions 710 and 715 have a different composition, film thickness and/or film type. Likewise, the backside coating 705 includes a first portion 720 and a second portion 725. The portions 720 and 725 have a different composition, film thickness and/or film type.

The different composition, film thickness and/or film type enables an electrostatic chuck to flatten the substrates 105 by a differential chucking force applied to the substrates 105. For example, utilizing the backside coating 700 on the substrate 105 shown in FIG. 7A, the first portion 710 enables a first chucking force 730 while the second portion 715 enables a second chucking force 735. The second chucking force 735 is greater than the first chucking force 730, which may be utilized to flatten the substrate 105 shown in FIG. 4A. In contrast, utilizing the backside coating 705 on the substrate 105 shown in FIG. 7B, the first portion 720 enables a first chucking force 740 while the second portion 725 enables a second chucking force 750. The second chucking force 750 is less than the first chucking force 740, which may be utilized to flatten the substrate 105 shown in FIG. 4B. The first portions 710 and 720 may be annular or ring-like and surround the second portions 715 and 725.

The backside coating 700 and the backside coating 705 are patterned coatings in this embodiment, and are formed in one of the backside processing chambers shown in FIGS. 1-3.

After flattening, the substrates 105 may be transferred to a deposition chamber to form the hardmask layer 505 shown in FIG. 5B. The backside coating 700 or the backside coating 705 may be etched after the hardmask layer 505 is formed, or left intact until processing of the substrates 105 is completed, as described above in FIG. 5C.

Figure 8:
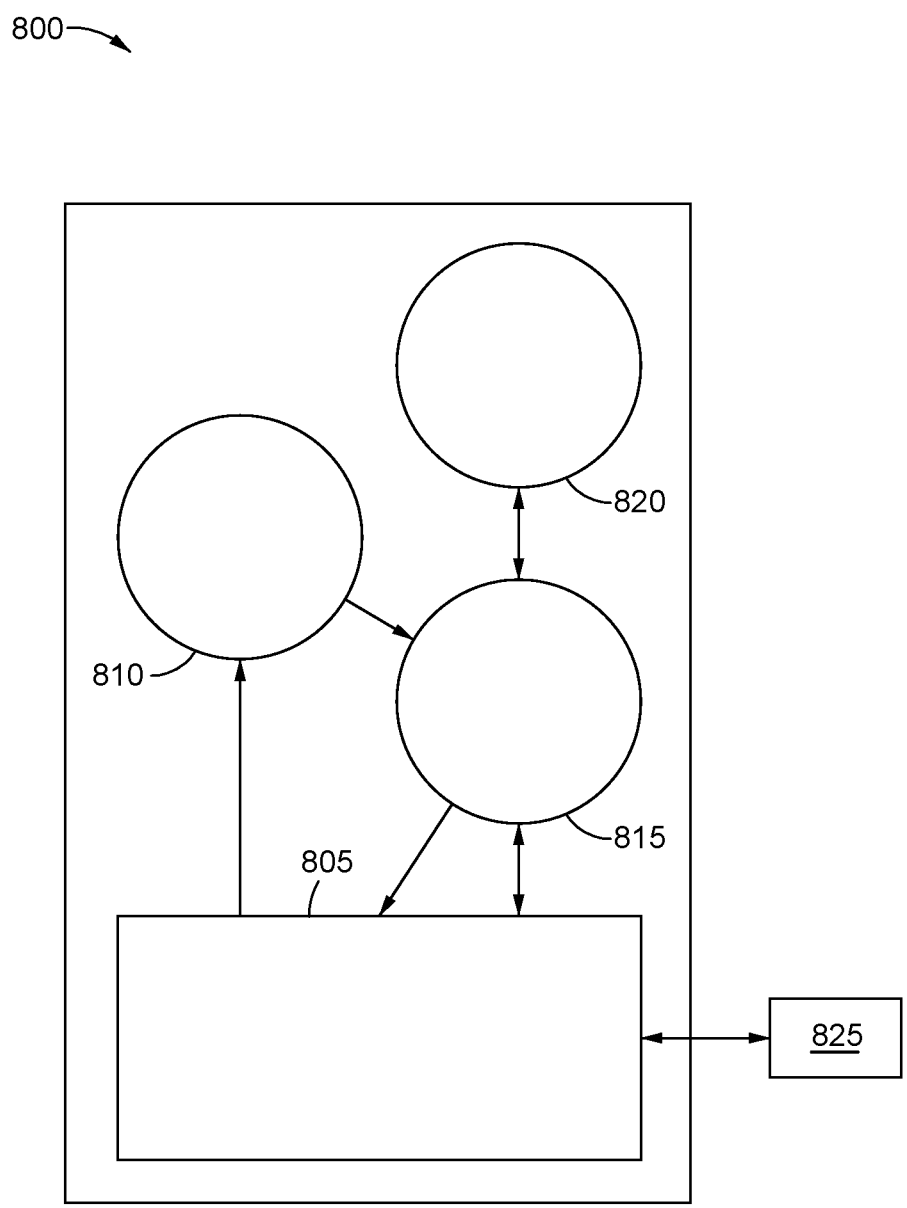
FIG. 8 is a schematic diagram of one embodiment of a fabrication tool for fabricating memory devices.

FIG. 8 is a schematic diagram of one embodiment of a fabrication tool 800 for fabricating memory devices. The fabrication tool 800 includes a loading chamber 805 where individual substrates are stored either before processing or after processing. The loading chamber 805 may be a factory interface that may function as a load lock chamber. The loading chamber 805 may store substrates in front opening unified pods (FOUPS) and includes a transfer device adapted to transfer substrates to and from one or more processing chambers of the fabrication tool 800.

In one processing sequence, a substrate (not shown) is transferred to a first processing chamber 810 where a deposition process is performed. For example, the first processing chamber 810 is utilized to deposit the memory film stack 110 as described above. After the memory film stack 110 is deposited, the substrate is bowed, such as a bow shown on the substrates 105 of FIG. 4A or 4B.

To eliminate the bow, the substrate having the memory film stack 110 thereon is transferred to a second processing chamber 815 for a deposition process. For example, the second processing chamber 815 is utilized to deposit a backside coating, such as the backside coating 500 shown in FIG. 5A, the backside coating 600 shown in FIG. 6A, the backside coating 605 shown in FIG. 6B, the backside coating 700 shown in FIG. 7A, or the backside coating 705 shown in FIG. 7B. The second processing chamber 815 may be any one of the backside processing chambers shown in FIGS. 1-3.

After the substrate is processed in the second processing chamber 815, the substrate, with the memory film stack 110 and backside coating thereon, is transferred to a third processing chamber 820 for a deposition process. For example, the third processing chamber 820 is a conventional deposition chamber where a hardmask layer is deposited on the memory film stack 110, such as the hardmask layer 505 shown and described in FIG. 5B.

In one embodiment of the processing sequence, the substrate is transferred to the second processing chamber 815 for an etch process in order to remove the backside coating. Alternatively, the substrate, with the memory film stack 110 and the backside coating thereon, is transferred from the third processing chamber 820 to the loading chamber 805, and to a fourth processing chamber 825. The fourth processing chamber 825 is a patterning system which consists of etching processes and/or lithographic processes that are utilized to process the hardmask layer and the memory film stack 110. In this alternative process, the backside coating remains on the substrate during patterning in the fourth processing chamber 825. After patterning in the fourth processing chamber 825, the substrate is transferred to the loading chamber 805 and to the second processing chamber 815 for an etch process in order to remove the backside coating.

FIG. 9 is a schematic diagram of one embodiment of a fabrication system 900 for fabricating memory devices. The fabrication system 900 includes a first tool 905 and a second tool 910. The first tool 905 includes a loading chamber 915 and the second tool 910 includes a loading chamber 805. The loading chamber 915 is similar to the loading chamber 805 described in FIG. 8. FOUPS are transferred between the first tool 905 and the second tool 910 based on processes performed therein.

The first tool 905 includes one or more deposition chambers 920 similar to the first processing chamber 810 described in FIG. 8. Each of the one or more deposition chambers are utilized to form the memory film stack 110 on substrates (not shown). After the memory film stack 110 is deposited, the substrate is bowed, such as a bow shown on the substrates 105 of FIG. 4A or 4B. The substrates are then transferred to the loading chamber 805 of the second tool 910. To eliminate the bow, the substrates having the memory film stack 110 thereon are transferred to the loading chamber 915, placed in FOUPS, and are then transferred to the loading chamber 805 of the second tool 910.

The second tool 910 includes a first processing chamber 925, which is similar to the second processing chamber 815 described in FIG. 8. The second tool 910 also includes a plurality of second processing chambers 930 each similar to the third processing chamber 820 described in FIG. 8.

The first processing chamber 925 is utilized to deposit a backside coating, such as the backside coating 500 shown in FIG. 5A, the backside coating 600 shown in FIG. 6A, the backside coating 605 shown in FIG. 6B, the backside coating 700 shown in FIG. 7A, or the backside coating 705 shown in FIG. 7B. The second processing chamber 815 may be any one of the backside processing chambers shown in FIGS. 1-3.

After the substrate(s) is processed in the first processing chamber 925, the substrate(s), with the memory film stack 110 and backside coating thereon, is transferred to one of the second processing chambers 930 for a deposition process. For example, the second processing chambers 930 are conventional deposition chambers where a hardmask layer is deposited on the memory film stack 110, such as the hardmask layer 505 shown and described in FIG. 5B.

In one embodiment of the processing sequence, the substrate(s) is transferred to the first processing chamber 925 for an etch process in order to remove the backside coating. Alternatively, the substrate(s), with the memory film stack 110 and the backside coating thereon, is transferred from the second processing chambers 930 to the loading chamber 805, and to the fourth processing chamber 825 for a patterning process described above. In this alternative process, the backside coating remains on the substrate(s) during patterning in the fourth processing chamber 825. After patterning in the fourth processing chamber 825, the substrate is transferred to the loading chamber 805 and to the first processing chamber 925 for an etch process in order to remove the backside coating.

Embodiments disclosed herein eliminate bow or warpage in a substrate produced by a structure formed on a first major surface thereof by depositing a backside coating on a second side thereof. The backside coating is deposited without the need to rotate or "flip" the substrate, which prevents damage to the structure, such as scratches. The methods disclosed herein, enabled by the apparatus disclosed herein, enable flattening of bowed substrates. This reduces patterning overlay errors, which increases yield. The methods disclosed herein removes out of plane distortion (OPD) as well as in-plane distortion (IPD). The portion of IPD (localized in-plane distortion or stretching deformation) is induced by the non-uniform stress of layer stacks (i.e., the memory film stack 110) formed on the substrate. Methods of "stress engineering" of backside coatings as described herein reduce/eliminate patterning overlay errors by removing IPD across the entire substrate. By implementing modulated or patterned back-coating film structures (varying film type, thickness, stress or any other film properties), in either radial or circumferential patterns, or any other suitable spatial distributions, substrate bow or IPD is reduced.

While the foregoing is directed to embodiments of the present disclosure, other and further embodiments of the disclosure may be devised without departing from the basic scope thereof, and the scope thereof is determined by the claims that follow.

What is claimed is:

1. A method for flattening a bowed substrate, the method comprising:
   coupling a first major surface of a substrate having a film stack formed on the first major surface to a stage within a chamber using a holder adapted to suspend the substrate, wherein the substrate comprises a bowed orientation, and the stage is vertically movable and includes a heater;
   flowing a gas to the first major surface;
   heating the substrate, and
   forming a coating on a second major surface of the substrate while flowing the gas, wherein the coating is configured to counter stresses produced by the film stack and flattens the substrate from the bowed orientation.

2. The method of claim 1, wherein the coating is a blanket film.

3. The method of claim 1, wherein the coating is a profiled film.

4. The method of claim 3, wherein the profiled film is concave.

5. The method of claim 3, wherein the profiled film is convex.

6. The method of claim 1, wherein the coating is a patterned film.

7. The method of claim 6, wherein the patterned film comprises a first portion and a second portion.

8. The method of claim 7, wherein the first portion has a composition, film thickness and/or film type that is different than a composition, film thickness and/or film type of the second portion.

9. The method of claim 7, wherein the first portion surrounds the second portion.

10. A method for flattening a bowed substrate, the method comprising:
    providing a substrate having a film stack formed on a first major surface thereof into a backside coating chamber having a gas distribution plate, wherein the substrate comprises a bowed orientation;
    adjusting a spacing between the substrate and the gas distribution plate within the chamber by moving a stage within the chamber, the stage being coupled to a stem that is vertically movable;
    heating the substrate; and
    forming a coating on a second major surface of the substrate, wherein the coating is configured to counter stresses produced by the film stack and flattens the substrate from the bowed orientation.

11. The method of claim 10, wherein the coating is a blanket film.

12. The method of claim 10, wherein the coating is a profiled film.

13. The method of claim 12, wherein the profiled film is concave.

14. The method of claim 12, wherein the profiled film is convex.

15. The method of claim 10, wherein the coating is a patterned film.

16. The method of claim 15, wherein the patterned film comprises a first portion and a second portion.

17. The method of claim 16, wherein the first portion has a composition, film thickness and/or film type that is different than a composition, film thickness and/or film type of the second portion.

18. A method for flattening a bowed substrate, the method comprising:
    coupling a substrate having a film stack formed on a first major surface thereof to a stage within a chamber, wherein the substrate comprises a bowed orientation;
    flowing a gas to the first major surface;
    heating the substrate using a heater within the stage, and
    forming a coating on a second major surface of the substrate using a patterned mask between the second major surface of the substrate and a perforated faceplate, wherein the coating is configured to counter stresses produced by the film stack and flattens the substrate from the bowed orientation.

19. The method of claim 18, wherein the coating comprises a first portion and a second portion.

20. The method of claim 19, wherein the first portion has a composition, film thickness and/or film type that is different than a composition, film thickness and/or film type of the second portion.

* * * * *